United States Patent
Bozso et al.

(10) Patent No.: US 6,756,651 B2
(45) Date of Patent: Jun. 29, 2004

(54) CMOS-COMPATIBLE METAL-SEMICONDUCTOR-METAL PHOTODETECTOR

(75) Inventors: Ferenc M. Bozso, Ridgefield, CT (US); Fenton Read McFeely, Ossining, NY (US); John Jacob Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/963,194

(22) Filed: Sep. 26, 2001

(65) Prior Publication Data

US 2003/0057507 A1 Mar. 27, 2003

(51) Int. Cl.[7] .................. H01L 27/14; H01L 31/00; H01L 31/0232; H01L 21/00
(52) U.S. Cl. ............... 257/448; 257/435; 257/437; 257/449; 257/453; 257/454; 257/455; 257/456; 257/457; 257/459; 257/428; 438/48; 438/72
(58) Field of Search ................. 257/435, 437, 257/448, 449, 453, 454, 455, 456, 457, 459, 428; 438/48, 72

(56) References Cited

U.S. PATENT DOCUMENTS

| | | | | |
|---|---|---|---|---|
| 5,464,977 A | * | 11/1995 | Nakagiri et al. | 250/234 |
| 5,674,778 A | * | 10/1997 | Lee et al. | 438/24 |
| 5,780,916 A | * | 7/1998 | Berger et al. | 257/21 |
| 5,879,827 A | * | 3/1999 | Debe et al. | 204/279 |
| 6,211,560 B1 | * | 4/2001 | Jimenez et al. | 257/451 |
| 6,396,117 B1 | * | 5/2002 | Furukawa et al. | 257/440 |

OTHER PUBLICATIONS

Device Electronics For Integrated Circuits, 2nd edition, Richard Muller and Theodore Kamins, pp. 126–128, 1986.*

* cited by examiner

Primary Examiner—Nathan J. Flynn
Assistant Examiner—Victor Mandala, Jr.
(74) Attorney, Agent, or Firm—Richard M. Ludwin, Esq.; McGinn & Gibb, PLLC

(57) ABSTRACT

A novel photodetector CMOS-compatible photodetector is disclosed in which photo-generation of carriers (electrons) is carried out in the metal of the electrodes, rather than as electron-hole pairs in the semiconductor on which the metal electrodes are deposited. The novel photo detector comprises a silicon or other semiconductor substrate material characterized by an electron energy bandgap, and a pair of metal electrodes disposed upon a surface of the silicon to define therebetween a border area of the surface. One of the two electrodes being exposed to the incident radiation and covering an area of said surface which is larger than the aforesaid border area, the aforesaid metal of the electrodes being characterized by a Fermi level which is within said electron energy bandgap.

25 Claims, 4 Drawing Sheets

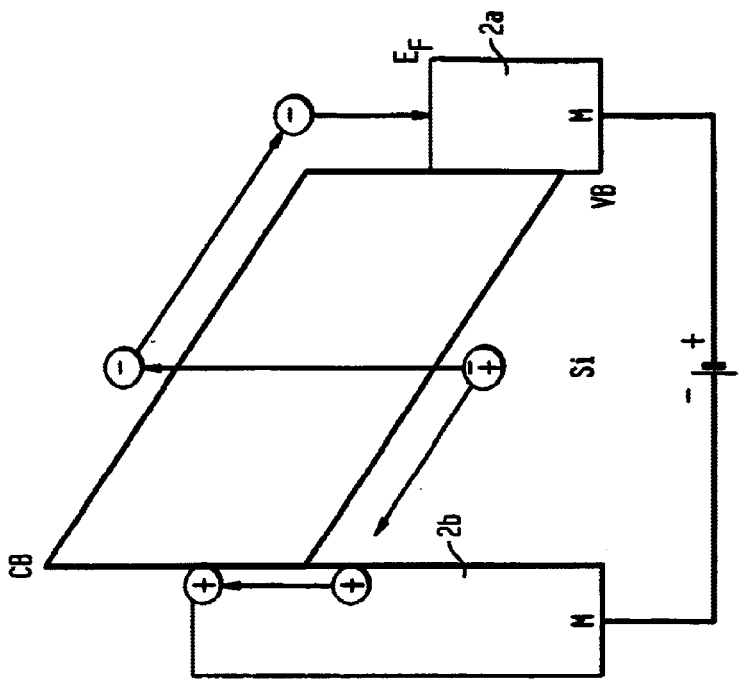
FIG. 1C
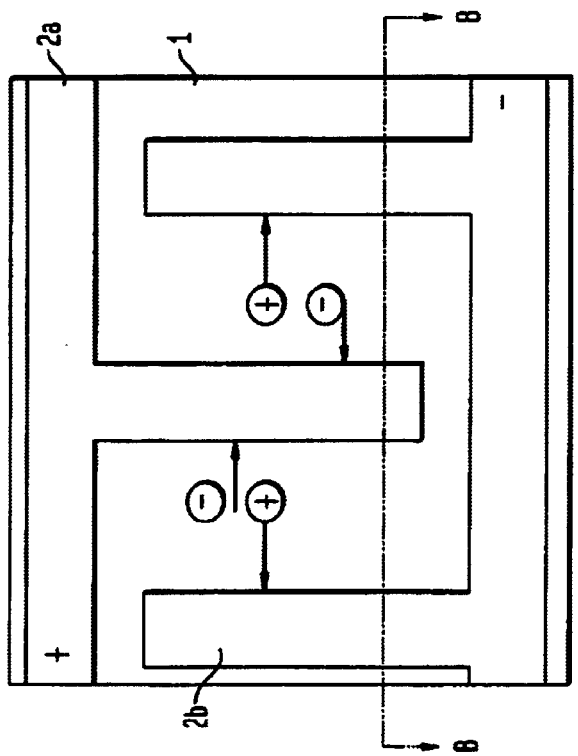
PRIOR ART FIG. 1A
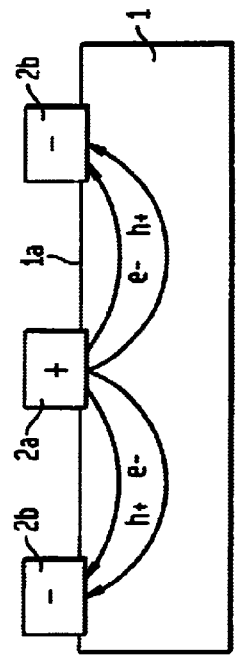
PRIOR ART FIG. 1B

PRIOR ART FIG. 3A
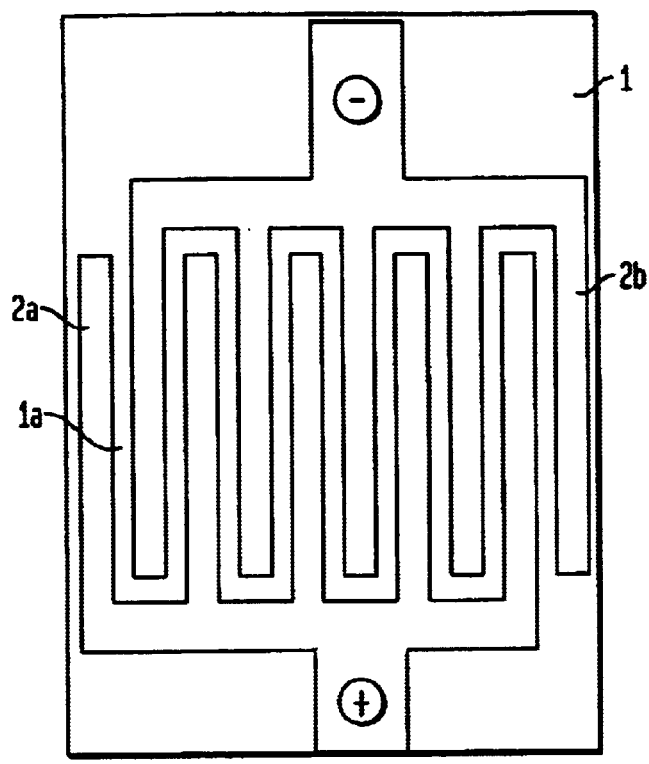
FIG. 3B
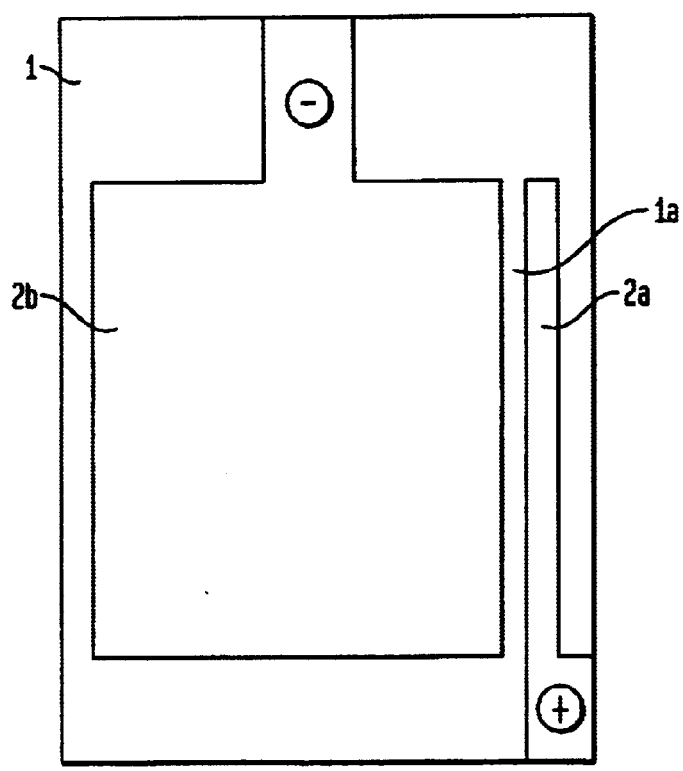

CMOS-COMPATIBLE METAL-SEMICONDUCTOR-METAL PHOTODETECTOR

FIELD OF THE INVENTION

The present invention relates to photodetectors, and in particular to Metal-Semiconductor-Metal (MSM) photodetectors.

BACKGROUND OF THE INVENTION

Metal-Semiconductor-Metal (MSM) detectors are simple planar devices that are used in high-speed photodetectors in fiber-optic data communication with bandwidth extending above 25 GHz. Prior art MSM detectors have consisted of interdigitated planar metal electrode pairs 2a, 2b on high-mobility semiconductor surfaces 1, as illustrated in the prior art structure of FIGS. 1A and 1B. The neighboring metal electrodes form a back-to-back Schottky-diode pair. Under both possible biasing polarities, one of the Schottky diodes is always reverse biased, therefore in the absence of light only a very small "dark-current" can flow as a result of thermal excitation and tunneling of carriers at the metal-semiconductor interface. When these prior art devices are illuminated with photons of sufficient energy, electron-hole pairs (shown as −/+ and e−/h+ in FIGS. 1A, 1B) are generated in the semiconductor 1 and the charge carriers are swept to the metal electrodes 2a, 2b under a few Volts bias. The photocurrent is proportional to the flux of photons impacting the uncovered border area 1a of semiconductor 1 within the total detector area.

For convenience, the "total device area" may defined as the minimum area definable by a simple closed convex curve chosen so that all of the metal of the photodetector lies within its interior (the metal would not include any wiring necessary to connect the device to an external circuit).

For discussion hereinbelow, we further define a "border area" 1a as the area of uncovered semiconductor 1 that is between the two metal electrodes 2a, 2b and within the total device area. The photogenerated charge by a light pulse is proportional to the number of photons in the pulse.

Two general points can be made about the performance of such prior art MSM photodetectors:

First, the magnitude of the photo-induced charge generated by a unit pulse of photons impacting the detector is directly proportional to the internal quantum yield (i.e. the probability that photoexcitation of electron-hole pairs takes place within a certain depth in the semiconductor) and magnitude of the border area of the detector.

Second, the speed of these prior art MSM photodetector is determined by the carrier mobility in the semiconductor, the distance the carriers have to travel from the point of generation to the electrodes; as well as, by the capacitance of the interdigitated metal electrodes For reasons of higher carrier mobility, quantum-yield and dark-current requirements, the more frequently used semiconductor substrates are III-V compound semiconductors (GaAs, AlGaAS, AlInAs, InGaP—InP, etc.) with a variety of Schottky-contact metals (Pt, Ti, Al, Au, Cu, W, . . . etc.). To achieve high speed, i.e. shorter detector response time, the width of the electrode fingers and the finger separations are on a micron to sub-micron scale. As can easily be appreciated, the requirements for sensitivity (a large photogenerated charge per unit light pulse) and speed are in conflict. Sensitivity is improved by increasing the border area, while speed is increased by moving the electrodes close together, which inherently decreases border area. Very thin, highly interdigitated electrodes, an apparent solution to this conflict in requirements, results in an increase in electrode resistance and total device capacitance, which decrease the device speed.

In data-communication the real physical source of transferred data is almost exclusively a silicon (CMOS) chip. Similarly, the transferred data is received for processing, storage or routing nearly exclusively by a CMOS device. Silicon-based optoelectronic devices, that can be monolithically integrated with these CMOS chips, would be therefore highly preferred. Prior art photodetectors, all III-V based devices, have a high packaging expense component when attached to the CMOS devices, and economy would suggest to replace the Ill-V semiconductors in these photodetectors with silicon. However silicon has a lower carrier mobility than the III-V semiconductors. This lower mobility has been perceived to cause unacceptable speed limitations, and has led to the neglect of silicon as semiconductor substrate of choice for high-speed photodetectors.

SUMMARY OF THE INVENTION

The present invention broadly provides a photodetector for detecting electromagnetic radiation which is incident thereon, the photodetector comprising:
  a) a substrate comprising a semiconductor material characterized by an electron energy bandgap, the aforesaid substrate having a surface, and
  b) a pair of electrodes disposed upon said surface to define therebetween a border area of the aforesaid surface, a first electrode of the aforesaid pair comprising a layer of metal disposed upon the aforesaid surface and exposed to the aforesaid incident radiation, the aforesaid first electrode covering an area of the aforesaid surface which is larger than the aforesaid border area, the aforesaid metal being characterized by a Fermi level which is within said bandgap.

Preferably, the semiconductor material is selected from silicon and an alloy of silicon and germanium. Moreover, the substrate may comprise a semiconductor layer deposited upon an insulator.

According to a preferred embodiment, the first electrode covers an area at least three times as large as said border area. Moreover, it is preferred that the metal comprise a member selected from the group consisting of Al, Co, Cr, Fe, Mn, Nb, Ru, Ta, Ti, V, W, and Zr.

According to another embodiment, the photodetector comprises a layer of insulator material disposed between the aforesaid surface of the semiconductor substrate and the aforesaid pair of electrodes, wherein the insulating layer is sufficiently insulating to substantially eliminate dark current between the pair of electrodes while permitting the flow of photogenerated current therebetween. For this purpose, the aforesaid layer of insulator material may be characterized by an electron energy bandgap of at least 3 ev.

Preferably, the layer of insulator material comprises $SiO_2$ and has a thickness of less that 50 Angstroms.

According to another embodiment, the aforesaid first electrode exhibits an anti-reflection treatment. This anti-reflection treatment may be effected by, for example, applying an anti-reflection coating (e.g. one that comprises SiN) or may alternatively comprise a roughening of an exposed surface of the aforesaid layer of metal.

Preferably, the energy difference between the Fermi level of the aforesaid metal of the first electrode and the midpoint of the semiconductor bandgap is no more than 20% of said semiconductor bandgap. One choice of metal is tungsten, which may be deposited by chemical vapor deposition from tungsten hexacarbonyl.

According to a preferred embodiment of the photodetector, the aforesaid layer of the first electrode is adapted to be exposed to the incident radiation over a first exposure area thereof, the aforesaid border area is adapted to be exposed to said incident radiation over a second exposure area and wherein said first exposure area is substantially larger than said second exposure area.

BRIEF DESCRIPTION OF THE DRAWINGS

FIG. 1A is a schematic plan view of a prior art MSM (Metal-Semiconductor-Metal) photoconductor.

FIG. 1B is a schematic cross-sectional view along line B—B of FIG. 1A.

FIG. 1C is a schematic view of charge carrier generation in the photoconductor of FIG. 1A.

FIG. 3A is a schematic plan view of a prior art MSM (Metal-Semiconductor-Metal) photoconductor.

FIG. 3B is a schematic plan view of a MSM (Metal-Semiconductor-Metal) photoconductor in accordance with the present invention.

DETAILED DESCRIPTION

Figure 2A:
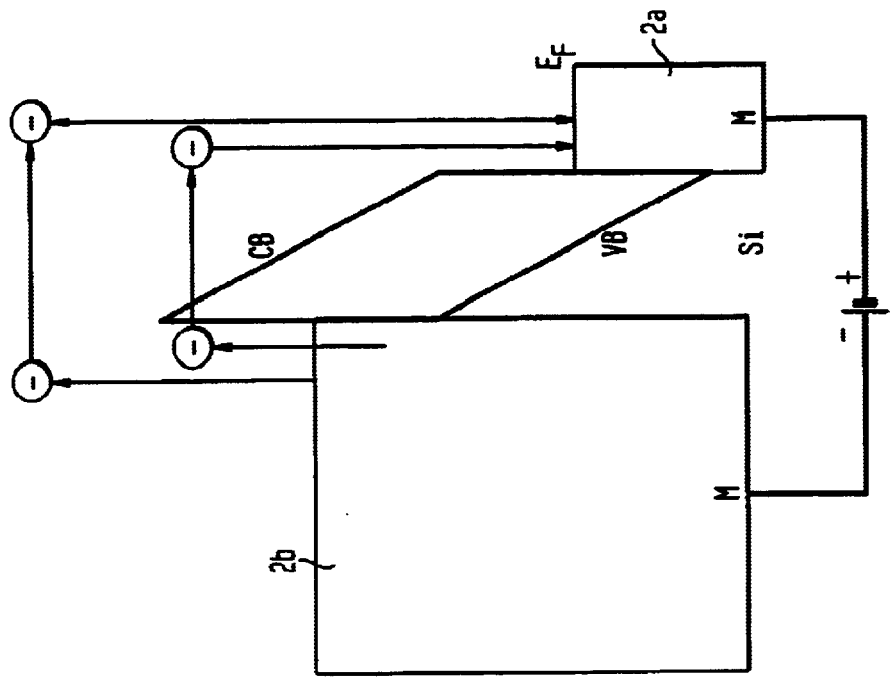
FIG. 2A is a schematic plan view of a MSM (Metal-Semiconductor-Metal) photoconductor in accordance with the present invention, where the semiconductor is Si.
Figure 2B:
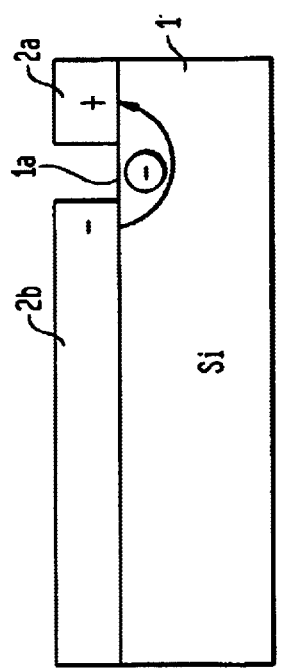
FIG. 2B is a schematic cross-sectional view along line B—B of FIG. 2A.

In this invention, a fundamentally new type of MSM photodetector is disclosed. This new photodetector with its novel structural features and principle of operation is illustrated in FIG. 2. This new MSiM photodetector is advantageously CMOS compatible. Its novel structure and electrode metal considerably reduce the negative effect of lower carrier mobility in silicon. This enables the fabrication of a high-speed, low-power MSiM detector for the 1–10 GBs data-rate range which is fully CMOS compatible. The detector has the potential for even higher data-rates, assuming that the speed of CMOS transistors in the sensing electronics improve above that level in coming CMOS device generations Embodiments of this new detector utilize at least some of the following three novel features.

1. Photo-generation of carriers in one of the METAL electrodes 2a, 2b of FIGS. 2A, 2B, rather than in the semiconductor 1 at its border area 1a.
2. A novel electrode geometry, that increases the active detector area by a factor of two, near to its theoretical upper limit.
3. Employing a special CMOS-compatible metal film as electrode material, with the metal Fermi-level optimally positioned in the silicon bandgap to produce the maximum photoresponse and minimum dark-current.

The first major novelty of the invention is the photo-generation of electrons in the electrode metal, rather than electron-hole pairs in the semiconductor. The electrode, used for the photoexcitation, which may referenced hereinbelow as the receiver electrode or simply receiver, is negatively biased. Its area is chosen to match the expected photon-beam spot-size, which is on the scale of 10 microns for single mode optical fibers and 60 microns for multi-mode fibers without focusing optics involved. A reasonable detector area therefore may range from 10×10 u to 100×100 square microns. Note that in contrast to prior art devices 100% of the incident light can therefore fall on the active photoreceiving part of the device because the metal electrode itself (not the border area) is used for this purpose. In the prior art device shown in FIG. 1, the border area 1a of the device is the active photoreceiver, and the design limitations imposed by the need for speed restricts this area to typically about 50% of the total device area. (In our new photodector, the border area 1a can be entirely non-illuminated during operation.)

In our new detectors nearly 100% of the photons are absorbed by the few nanometer thick metal film of electrodes 2a, 2b comprising the receiver, since the reflection can be reduced to ~5% by proper anti reflection coating. The absorption of the usual 850 nm, 1300 nm and 1500 nm photons excites the metal electrons to energies in a range extending above the conduction band minimum of the underlying semiconductor. These photo-excited electrons may transfer from negatively biased electrode 2b across the semiconductor border area 1a to the positively biased electrode 2a via ballistic transport or by resonant tunneling processes. The electron time-of-flight (TOF) in these processes is much shorter than the diffusion-time of electrons and holes generated in the border area 1a of the prior art devices. In the semiconductors comprising the border area material of prior art devices, the dominant charge transfer process is diffusion driven and can be characterized by a much lower effective mobility. Holes and the even lower hole-mobility play no role in the photocurrent in the new photodetector, therefore unlike prior art MSM detectors, a tail in the photocurrent, due to the lower-mobility holes is absent. These considerations have an extremely important ramification for the materials from which our new photo-detector can be fabricated. Because the tunneling resonant tunneling and ballistic transport used in devices of the present invention are inherently so much faster than the drift-diffusion transport across the border area 1a (as in prior art devices) it becomes completely practical to employ silicon for the semiconducting material. Clearly it is also possible to reduce the border area 1a (separation between the receiver electrode 2b and the positively biased collector electrode 2a) in order to reduce the electron TOF, without sacrificing sensitivity, since the border area 1a is no longer used as the receiver. Since the electrons are generated in the electrode metal 2b, the silicon layer (border area) 1a separating the electrodes can be on a lower sub-micron scale. The width of the silicon border area 1a is limited only by the level of acceptable dark current and available lithography. Since the silicon for the new device can be undoped, a lithography-limited silicon width of ~100–200 nm may be used. In conventional MSM detectors a large portion of carriers must travel distances in excess of 1 micron, depending on the depth and position of their photo-generation. The consequence of this is a ~10× higher TOF and corresponding lower detector speed and response time.

The second major design novelty of the inventive photodetector device is the electrode geometry illustrated by way of example in FIGS. 3A, 3B. By moving the photoexcitation from the semiconductor to the metal (as in FIG. 3B), the need for the interdigitated electrode structure 2a, 2b (as in FIG. 3A) in the prior art devices is eliminated, which simplifies the lithography and enhances device reliability by reducing the probability of shorts between the fingers 2a, 2b. The new electrode geometry also increases the photo-yield since the total electrode surface 2b is active detector area. In conventional MSM detectors (e.g. FIG. 3A) the active surface (i.e. border area) is only ~60% of the total detector area, because ~40% of the semiconductor surface is covered and blocked by the interdigitated electrodes. The higher active area 2b of the new detector of FIG. 3B, where the metal electrode preferably covers an area at least three times the exposed border area 1a, may lead to a 2× higher sensitivity and speed. The new detector also has a ~10× lower device capacitance. The cost of maximizing the active detector area and reducing carrier time-of-flight via interdigitated electrodes is a ~10 higher device capacitance in the prior art MSM detectors. Removing this source of capacitance by replacing the interdigitated electrodes of FIG. 3A with the simple capacitance minimizing collector-receiver geometry shown in FIG. 3B gives the new detector a ~10× sensitivity and speed advantage. The new detector geometry also reduces the length of the Metal-Semiconductor interface by a factor of 10. This results in a ~10× reduction of dark-current, compared to conventional MSM electrode structures.

Lower dark-current of the novel photodetectors results in higher detector sensitivity and speed. Finally we observe that the much simpler structure of the new detector is easier and cheaper to fabricate and the device is more reliable for long term use.

Figure 2C:
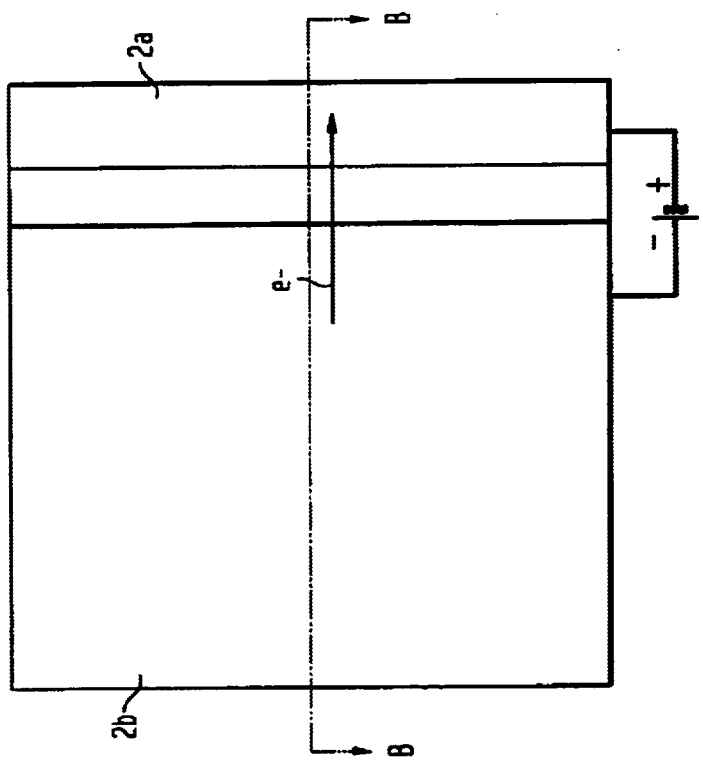
FIG. 2C is a schematic view of charge carrier generation in the photoconductor of FIG. 2A.

From FIG. 2C, it may be observed that the position of the electrode metal Fermi-level in contact with the semiconductor (relative to the valence band VB and conduction band CB) has an effect on the dark-current and on the photon cutoff wavelength, i.e. the photon energy to which the detector still can respond A simple practical optimum is when the Fermi-level of the metal is exactly in the middle of the bandgap (Eb). In that case the detector still can respond to photons of ~0.5 Eb energy (~0.55 eV for Si), on the other hand the dark-current is very low because the tunneling probability of thermally excited carriers facing a ~0.5 Eb potential barrier (~0.55 eV for Si) is extremely low. If a detector with a smaller energy threshold were desired, a metal with a somewhat smaller work function could be employed, albeit with somewhat higher leakage current. In practice, a metal with a Fermi level energy differing from the midgap position by no more than 20% of the total bandgap energy is a reasonable practical choice.

Figure 4A:
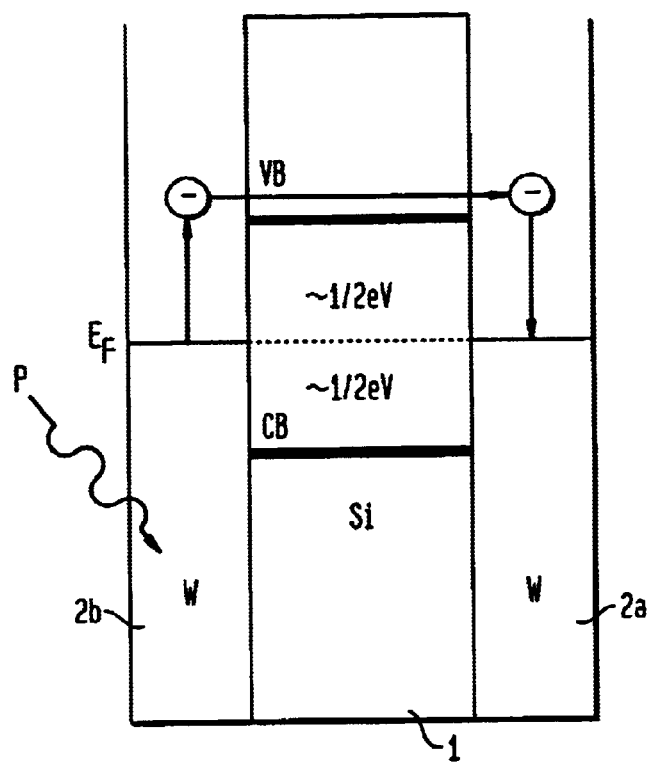
FIG. 4A is a schematic view of charge carrier generation in an MSiM photoconductor according to the invention, where the metal is tungsten, and where no voltage bias is applied between the pair of electrodes.
Figure 4B:
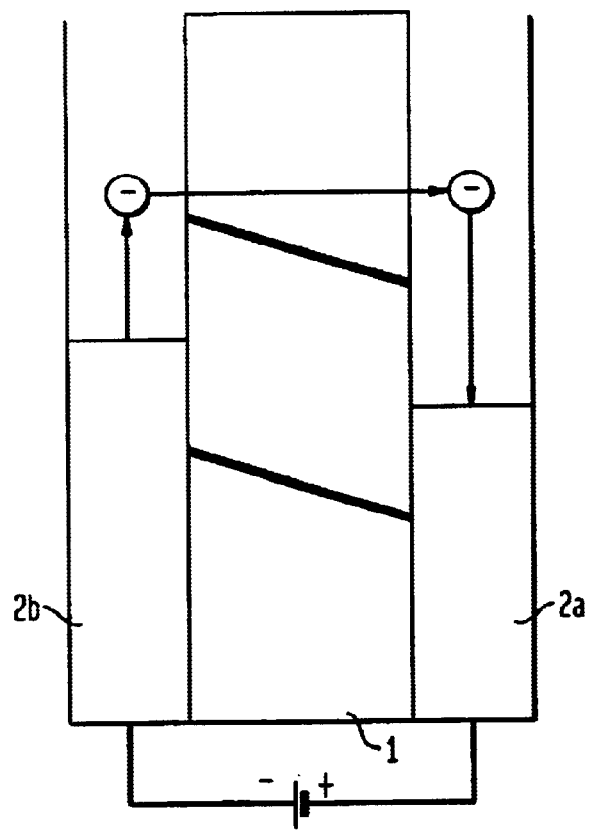
FIG. 4B is a schematic view of charge carrier generation in an MSiM photoconductor according to the invention, where the metal is tungsten, and where a voltage bias is applied between the pair of electrodes.

A preferred choice of electrode metal for the disclosed MSiM photodetector is tungsten. W has its Fermi-level very close to the silicon midgap position. For two preferred embodiments of the photodetector a tungsten electrode was grown on clean silicon surfaces and on thin silicon-dioxide (2–3 monolayers covered silicon surfaces. When the photodetector is fabricated using tungsten as the metal electrodes, its Fermi level is almost exactly in midgap position, as shown in FIG. 4. This means that ~0.6 eV photon energy (indicated by incident photon P) is enough to excite electrons above the silicon conduction band, therefore the detector can be used for all the standard datacom and telecom wavelengths (~850 nm, ~1300 nm, ~1500 nm). Tungsten has several other characteristics which make it a preferred choice. The lithography and etching of W is simple and well worked out. It furthermore is already a material routinely used in CMOS devices. In addition it is compatible with the deposition of a silicon nitride anti reflection coating.

For a prototype of the preferred embodiment, silicon was selected as the semiconductor substrate material. Tungsten was deposited onto the substrates via chemical vapor deposition from Tungsten hexacarbonyl in a low pressure, high vacuum reactor at a substrate temperature of approximately 450 C. Substrates were prepared for deposition in two ways. Some substrates were inserted into the reactor untreated. Thus a thin insulator film (a few monolayers) of silicon dioxide was present between the silicon and the tungsten in the devices prepared in this fashion.

Other substrates were prepared by first stripping off the native oxide by etching in a 10:1 HF/H2O solution, immediately prior to insertion into the tungsten deposition reactor. These devices thus lacked any intervening insulator oxide layer between the silicon and the tungsten. All other aspects of fabrication were identical. It was found that the inclusion or removal of the thin native oxide layer had no significant effect on the performance of the photodetectors. The tungsten coated substrates were then patterned via standard lithographic and etching techniques into structures having the shape shown in FIG. 2A and FIG. 3B, where the collector electrode was 30×30 microns square. The detectors thus fabricated were then tested using 850 nm light. Biases from 0–6 volts were investigated. The threshold for the production of photocurrent was observed at a bias of 0.3 V, and rose rapidly up to 1.5 V. Above 1.5 V only a relatively small rise in DC photosignal was observed. For fast AC response, it was found to be desirable to operate the device at voltages less than or equal to 1.5 V. Under these conditions, pulses of better than 170 picoseconds full width at half maximum, with a rise time of approximately 70 ps were observed. Moreover, the pulses were observed to be extremely symmetric, with no longtime tails (such as due to slow hole transport in prior art devices). At operating voltages above 1.5 V, however, such tails began to manifest themselves. It is possible that these tails result from impact ionization caused by the hot electrons generated by the higher bias voltage. As three is little total peak signal gain in operating the device above 1.5 V, there is little practical consequence to restricting the operation to this value. The dark current densities of all devices were all extremely low, less than 0.1 mA/cm$^2$.

While the present invention has been described with reference to preferred embodiments thereof, numerous obvious changes and variations may readily be made by persons skilled in the field of photodetectors. Accordingly, the invention should be understood to include all such variations to the full extent embraced by the claims.

What is claimed is:

1. A photodetector for detecting electromagnetic radiation which is incident thereon, said photodetector comprising:

a) a substrate comprising a semiconductor material characterized by an electron energy bandgap, said substrate having a surface, wherein said semiconductor material is selected from silicon and an alloy of silicon and germanium; and b) a pair of electrodes disposed upon said surface to define therebetween a border area of said surface, a first electrode of said pair comprising a layer of metal disposed upon said surface and exposed to said incident radiation, said first electrode covering an area of said surface which is larger than said border area such that photoabsorption, allowing the electromagnetic radiation detection, occurs in said metal of said first electrode, said metal being characterized by a Fermi level which is within said bandgap.

2. A photodetector as set forth in claim 1, wherein said first electrode covers an area at least three times as large as said border area.

3. A photodetector as set forth in claim 1, said metal comprising a member selected from the group consisting of Al, Co, Cr, Fe, Mn, Nb, Ru, Ta, Ti, V, W, and Zr.

4. A photodetector as set forth in claim 1, wherein said first electrode exhibits an anti-reflection treatment.

5. A photodetector as set forth in claim 4, wherein said anti-reflection treatment comprises an anti-reflection coating.

6. A photodetector as set forth in claim 5, wherein said anti-reflection coating comprises SiN.

7. A photodetector as set forth in claim 4, wherein said anti-reflection treatment comprises a roughening of an exposed surface of said layer of metal.

8. A photodetector as set forth in claim 1, wherein said metal comprises tungsten.

9. A photodetector as set forth in claim 8, wherein said tungsten is deposited by chemical vapor deposition from tungsten hexacarbonyl.

10. A photodetector as set forth in claim 1, wherein the energy difference between the Fermi level of said metal and the midpoint of the semiconductor bandgap is no more than 20% of said semiconductor bandgap.

11. A photodetector as set forth in claim 1, wherein said layer of said first electrode is adapted to be exposed to said incident radiation over a first exposure area thereof, said border area is adapted to be exposed to said incident radiation over a second exposure area and wherein said first exposure area is substantially larger than said second exposure area.

12. A photodetector as set forth in claim 11, said metal comprising a member selected from the group consisting of Al, Co, Cr, Fe, Mn, Nb, Ru, Ta, Ti, V, W, and Zr.

13. A photodetector as set forth in claim 11, wherein said first electrode exhibits an anti-reflection treatment.

14. A photodetector as set forth in claim 13, wherein said anti-reflection treatment comprises an anti-reflection coating.

15. A photodetector as set forth in claim 14, wherein said anti-reflection coating comprises SIN.

16. A photodetector as set forth in claim 13, wherein said anti-reflection treatment comprises a roughening of an exposed surface of said layer of metal.

17. A photodetector as set forth in claim 11, wherein the energy difference between the Fermi level of said metal and the midpoint of the semiconductor bandgap is no more than 20% of said semiconductor bandgap.

18. The structure according to claim 1, wherein said photodetector comprises a photodetector formed entirely of complementary metal oxide semiconductor (CMOS)—compatible materials.

19. A photodetector for detecting electromagnetic radiation which is incident thereon, said photodetector comprising:

a) a substrate comprising a semiconductor material characterized by an electron energy bandgap, said substrate having a surface;

b) a pair of electrodes disposed upon said surface to define therebetween a border area of said surface, a first electrode of said pair comprising a layer of metal disposed upon said surface and exposed to said incident radiation, said first electrode covering an area of said surface which is larger than said border area such that photoabsorption, allowing the electromagnetic radiation detection, occurs in said metal of said first electrode, said metal being characterized by a Fermi level which is within said bandgap; and c) a layer of insulator material disposed between said surface and said pair of electrodes, said layer of insulator material being characterized by an electron energy bandgap of at least 3 eV.

20. A photodetector as set forth in claim 19, wherein said layer of insulator material comprises $SiO_2$ and has a thickness of less than 50 Angstroms.

21. A photodetector for detecting electromagnetic radiation which is incident thereon, said photodetector comprising:

a) a substrate comprising a semiconductor material characterized by an electron energy bandgap, said substrate having a surface;

b) a pair of electrodes disposed upon said surface to define therebetween a border area of said surface, a first electrode of said pair comprising a layer of metal disposed upon said surface and exposed to said incident radiation, said first electrode covering an area of said surface which is larger than said border area such that photoabsorption, allowing the electromagnetic radiation detection, occurs in said metal of said first electrode, said metal being characterized by a Fermi level which is within said bandgap, and c) an insulating layer disposed between said surface and said pair of electrodes, wherein said layer of said first electrode is adapted to be exposed to said incident radiation over a first exposure area thereof, said border area is adapted to be exposed to said incident radiation over a second exposure area and wherein said first exposure area is substantially larger than said second exposure area, wherein said insulating layer is sufficiently insulating to substantially eliminate dark current between said pair of electrodes while permitting the flow of photogenerated current therebetween.

22. A photodetector as set forth in claim 21, wherein said insulation layer comprises $SiO_3$, and has a thickness of less than 50 Angstroms.

23. A photodetector for detecting electromagnetic radiation which is incident thereon, said photodetector comprising:

a) a substrate comprising a semiconductor material characterized by an electron energy bandgap, said substrate having a surface, wherein said semiconductor material is selected from silicon and an alloy of silicon and germanium; and b) a pair of electrodes disposed upon said surface to define therebetween a border area of said surface, a first electrode of said pair comprising a layer of metal disposed upon said surface and exposed to said incident radiation, said first electrode covering an area of said surface which is larger than said border area such that photoabsorption, allowing the electromagnetic radiation detection, occurs in said metal of said first electrode, said metal being characterized by a Fermi level which is within said bandgap, wherein said layer of said first electrode is adapted to be exposed to said incident radiation over a first exposure area thereof, said border area is adapted to be exposed to said incident radiation over a second exposure area and wherein said first exposure area is substantially larger than said second exposure area, wherein said metal comprises tungsten.

24. A photodetector as set forth in claim 23, wherein said tungsten is deposited by chemical vapor deposition from tungsten hexacarbonyl.

25. A photodetector for detecting electromagnetic radiation which is incident thereon, said photo detector comprising:
 a) substrate comprising a semiconductor material characterized by an electron energy bandgap, said substrate having a surface; and
 b) a pair of electrodes disposed upon said surface to define therebetween a border area of said surface, a first electrode of said pair comprising a layer of metal disposed upon said surface and exposed to said incident radiation.

said first electrode covering an area of said surface which is larger than said border area such that photoabsorption, allowing the electromagnetic radiation detection, occurs in said metal of said first electrode, said metal being characterized by a Fermi level which is within said bandgap, wherein said substrate comprises a semiconductor layer deposited upon an insulator.

* * * * *